United States Patent
Wang et al.

(10) Patent No.: US 11,802,924 B2
(45) Date of Patent: Oct. 31, 2023

(54) MAGNETIC RESONANCE IMAGING SUPERCONDUCTING MAGNET SYSTEM

(71) Applicant: Institute of Electrical Engineering, Chinese Academy of Sciences, Beijing (CN)

(72) Inventors: Qiuliang Wang, Beijing (CN); Jianyi Xu, Beijing (CN); Xinning Hu, Beijing (CN)

( * ) Notice: Subject to any disclaimer, the term of this patent is extended or adjusted under 35 U.S.C. 154(b) by 676 days.

(21) Appl. No.: 16/959,670

(22) PCT Filed: Dec. 21, 2018

(86) PCT No.: PCT/CN2018/122526
§ 371 (c)(1),
(2) Date: Jul. 1, 2020

(87) PCT Pub. No.: WO2019/134533
PCT Pub. Date: Jul. 11, 2019

(65) Prior Publication Data
US 2021/0080527 A1      Mar. 18, 2021

(30) Foreign Application Priority Data

Jan. 2, 2018 (CN) .......................... 201810001458.7

(51) Int. Cl.
*G01R 33/3815* (2006.01)
*G01R 33/38* (2006.01)
*H01F 6/04* (2006.01)

(52) U.S. Cl.
CPC ..... *G01R 33/3815* (2013.01); *G01R 33/3804* (2013.01); *H01F 6/04* (2013.01)

(58) Field of Classification Search
CPC .................... G01R 33/3804; G01R 33/3815
See application file for complete search history.

(56) References Cited

U.S. PATENT DOCUMENTS

| 4,924,198 A | * | 5/1990 | Laskaris | ............ G01R 33/3815 324/318 |
| 5,111,665 A | * | 5/1992 | Ackermann | .......... F25D 19/006 62/297 |

FOREIGN PATENT DOCUMENTS

| CN | 1892931 A | 1/2007 |
| CN | 101275793 A | 10/2008 |

(Continued)

OTHER PUBLICATIONS

International Search Report and Written Opinion received in corresponding International Application No. PCT/CN2018/122526, dated Mar. 22, 2020, with English translation.

(Continued)

*Primary Examiner* — Ramon M Barrera
(74) *Attorney, Agent, or Firm* — Verrill Dana, LLP; Robert L. Hover (57) ABSTRACT

An intelligent liquid helium-free whole-body magnetic resonance imaging superconducting magnet system, comprising: a vacuum container, provided with a main magnetic field superconducting coil in a radially inner side position therein, and a shielding superconducting coil in a radially outer side position therein, and a heat pipe gas tank is arranged in a vacant area between the main magnetic field superconducting coil and the shielding superconducting coil; a liquid helium reservoir, communicated with a liquid-gas storage tank, and connected with the main magnetic field superconducting coil or the shielding superconducting coil via a helium self-oscillation heat pipe; a refrigerator, fixed on the vacuum container through a thermal conduction component auto-pluggable component; the first thermal conduction component connected with the refrigerator is in close contact with the thermal radiation screen assembly, and the second thermal conduction component connected with the (Continued)

refrigerator is in close contact with the liquid helium reservoir.

12 Claims, 3 Drawing Sheets

(56) References Cited

FOREIGN PATENT DOCUMENTS

| | | | | |
|---|---|---|---|---|
| CN | 201749756 U | 2/2011 | | |
| CN | 103606430 A | 2/2014 | | |
| CN | 103845057 A | 6/2014 | | |
| CN | 103890870 A | 6/2014 | | |
| CN | 104919258 A | 9/2015 | | |
| CN | 105501679 A | 4/2016 | | |
| CN | 108022711 A | 5/2018 | | |
| EP | 3232143 A1 | 10/2017 | | |
| JP | 2004055643 A | * | 2/2004 | ............ H01F 6/003 |
| JP | 5675578 B2 | 2/2015 | | |

OTHER PUBLICATIONS

First Office Action received in priority CN Application No. 201810001458.7, dated Jun. 10, 2019, with English translation.
Second office Action received in priority CN Application No. 201810001458.7, dated Oct. 23, 2019, with English translation.
Notice of Grant of Patent Right to the Invention received in priority CN Application No. 201810001458.7, dated Jan. 23, 2020, with English translation.

* cited by examiner

MAGNETIC RESONANCE IMAGING SUPERCONDUCTING MAGNET SYSTEM

CROSS REFERENCE

This disclosure is a United States National Stage of International Application No. PCT/CN2018/122526, filed Dec. 21, 2018, which claims priority to Chinese patent application number 201810001458.7 filed on Jan. 2, 2018, the entire contents of both applications are incorporated in the present application by reference.

TECHNICAL FIELD

This disclosure relates to a superconducting magnet system to be used in the field of magnetic resonance whole-body imaging, in particular to an intelligent liquid helium-free superconducting magnetic resonance system.

BACKGROUND

Magnetic resonance imaging (MRI) uses magnetic resonance phenomenon of the nucleus (such as proton) in a uniform magnetic field to perform imaging of different tissues and organs inside human body, so as to realize functions such as medical diagnosis. The signal-to-noise ratio of the magnetic resonance imaging is proportional to the intensity of magnetic field, so the higher the field intensity, the better the resolution of the magnetic resonance imaging, which is more conducive for the doctor to make accurate diagnosis and achieve the function of complex imaging. At present, 1.5 T magnetic resonance imaging system is the mainstream on market at home and abroad, and 3 T or even higher magnetic field imaging system has the faster pace of development.

Early permanent magnetic resonance imaging systems with low magnetic field strength (generally less than 0.7 T) have been gradually phased out. In order to achieve high field intensity magnetic resonance imaging, it is necessary to use a superconducting magnetic resonance imaging system, i.e., systems using superconducting magnet to generate strong magnetic field required for magnetic resonance imaging. Superconducting magnet can produce a strong magnetic field, but needs extremely low-temperature working conditions to meet the requirements of reaching a critical temperature of superconductors (for commercial magnetic resonance imaging, superconducting magnet generally has a critical temperature lower than 7 K), and above the critical temperature of the superconductor, the superconducting magnet does not work properly.

In order to generate and maintain the extremely low-temperature working conditions required by the superconducting magnet, the traditional approach is to soak the superconducting magnet in liquid helium (at the boiling point 4.2 K thereof under one bar pressure) as a refrigeration agent, so as to transfer outward Joule heat from heat radiation in the external environment of the magnet, heat conduction leakage of a magnet supporting part, as well as magnet joint resistance, and thus maintaining the extremely low-temperature conditions required by normal operation of the magnet. However, in the process of soaking the superconducting magnet using the liquid helium, the liquid helium is continuously consumed, which requires regular replenishment for the magnet. The operation process is very complicated and requires professional maintenance. In addition, liquid helium is a scarce resource and very expensive, with its access limited to foreign countries (helium is mainly produced in the United States), thus resource security cannot be guaranteed.

In order to reduce the liquid helium loss in the magnet soaking process, the liquid helium is condensed from volatile helium by a refrigerator and returned to the magnet, a kind of technology which is increasingly applied and in great demand particularly for areas difficult to access supply of liquid helium. However, the technology still requires using a large amount of liquid helium as a refrigerator, and large quantities of liquid helium are still consumed in magnet quench and in the process of magnet excitation and demagnetization.

In the last decade or so, transmission cooling technology has been developed for refrigeration of the superconducting magnet. However, the traditional transmission cooling technology uses high purity copper as a cooling channel between a refrigeration head and the magnet. However, due to the poor thermal conductivity of copper, this can only satisfy the cooling requirements of small superconducting magnets, it is difficult to ensure that all parts of the magnet are uniformly cooled for a superconducting magnet for whole body imaging magnetic resonance. Therefore, Siemens proposes a method using a hot siphon pipe to cool down a superconducting magnet, which is performed by winding a hot siphon pipe around the surface of a superconducting coil, and transfers the cooling capacity of the refrigerator cooling head continuously to the superconducting magnet using thermal siphoning technology with high thermal conductivity and self-cycling working medium, thus maintaining the extremely low temperature conditions of the magnet, this method uses only a very small amount of liquid helium as the working medium for the siphon pipe to achieve uniform cooling of the magnet. Philips has also proposed a method of cooling the superconducting magnet using a pipe without using an additional cryogenic pump to drive the pipe working medium, thus realizing circular flow of the working medium in the pipe between the magnet and the refrigerator cooling head as well as transmission of the cooling capacity. For thermal siphoning technology, however, circulation of the working medium is driven by gravity, and therefore, its application is subject to relative positions of refrigerator cooling head and the magnet. As to the technique using the cryogenic pump, the technique is less reliable, due to increased complexity of the system resulted from requirement for additional electric driving and regular maintenance of the cryogenic pump. Therefore, it is necessary to devise an extremely low-temperature heat transfer technique with desirable performance and reliability for whole-body imaging superconducting magnet system refrigeration.

The adoption of the refrigerator for cooling a superconducting magnet requires external power to maintain operation of the refrigerator (e.g., a pulse tube refrigerator 1.5 W@4K, 380V, 5 kW), once failure happens in an external power supply, the refrigerator is not able to keep generating cooling capacity to the magnet, and the refrigerator cooling head will experience rapid temperature rise and become itself the largest heat leaking source of the magnet system, making the temperature of the magnet increases rapidly, which can easily cause the temperature of superconducting magnet to exceed the critical temperature and thus lead to magnet quench. Although the magnet system is generally provided with a quench protection device, high voltages, hot spot temperature rise, and eddy current stress accompanying the quench process still bring a potential risk of damage to the superconducting magnet system, and the fault in the power system can bring permanent damage to the magnet if not removed quickly. Up to now, no improvements are reported to solve this problem, and therefore, new technology is needed to be devised to significantly reduce heat leakage by the refrigerator to the superconducting magnet system after occurrence of fault in the power system.

In the whole working process of the magnet, such as refrigeration, excitation, stable operation, troubleshooting, demagnetization and other steps, all steps are generally needed to be conducted by trained professionals of manufacturers or their own professionals, excluding the step of stable operation. It not only brings high maintenance and operating costs, but also puts the magnet system at a risk of damage if artificial operation conducts not in time or not properly. Currently, there are no reports on a superconducting magnet surveillance system that does not require human intervention at all, so it is necessary to develop a superconducting magnet surveillance system which is more automated and more intelligent, so as to overcome the problem mentioned above brought by human operation.

SUMMARY

The purpose of this disclosure is to propose an intelligent liquid helium-free whole-body magnetic resonance imaging superconducting magnet system, to overcome the problem of poor performance and reliability of the conducting and cooling system of an existing whole body imaging magnetic resonance superconducting magnet system, as well as complex maintenance and poor reliability of the superconducting magnet system.

The purpose of the present disclosure is achieved through the following technical solutions:

an intelligent liquid helium-free whole-body magnetic resonance imaging superconducting magnet system, comprising:

a vacuum container, which is of an enclosed hollow cylindrical shape, provided along its inner wall with a thermal radiation screen assembly constituting a closed hollow cylinder working cabin; a radial internal space in the hollow cylinder working cabin is provided with a main magnetic field superconducting coil, a radial outer-side space in the hollow cylinder working cabin is provided with a shield magnetic field superconducting coil, and a heat pipe gas tank is arranged in a vacant area between the main magnetic field superconducting coil and the shield magnetic field superconducting coil;

a liquid helium reservoir, communicated with a liquid-gas storage tank and connected with the main magnetic field superconducting coil or the shield magnetic field superconducting coil through a helium self-oscillation heat pipe which is further communicated with the heat pipe gas tank;

a refrigerator, fixed on the vacuum container through an auto-pluggable component of the thermal conduction component; a first thermal conduction component connected with the refrigerator is in close contact with the thermal radiation screen assembly, and the second thermal conduction component connected with the refrigerator is in close contact with the liquid helium reservoir.

Optionally, the vacuum container comprises a cylindrical inner tube, a cylindrical outer tube and circular end members at both ends, wherein the cylindrical inner tube is coaxial with the cylindrical outer tube, the cylindrical outer tube has a diameter greater than that of the cylindrical inner tube, and the circular end members connect the cylindrical inner tube and the cylindrical outer tube to form a sealed cover.

Optionally, the helium self-oscillation heat pipe comprises a hot end, a cold end and an adiabatic zone, the hot end is tightly wound on an outer surface of the main magnetic field superconducting coil and the shield magnetic field superconducting coil respectively, the cold end is wound on the liquid helium reservoir, and an adiabatic zone is arranged between the hot end and the cold end and provided with a gas connection channel and communicated with the heat pipe gas tank.

Optionally, when the superconducting magnet system does not conduct refrigeration, both the liquid-gas storage tank and the heat pipe gas tank store and seal high-pressure helium gas;

When the superconducting magnet system conducts refrigeration, the second thermal conduction component connected with the refrigerator condenses helium gas in the liquid-gas storage tank into liquid helium in a liquid storage tank through the liquid helium reservoir, and the helium gas in the heat pipe gas tank is in turn condensed into liquid helium in a cold end of the helium self-oscillation heat pipe, so as to form helium self-oscillation gas-liquid circulation, transfer the cooling capacity of the refrigerator to the main magnetic field superconducting coil and the shield magnetic field superconducting coil, and cool the superconducting magnet system to a working temperature.

Optionally, the magnetic resonance imaging superconducting magnet system comprises one group or multiple groups of helium self-oscillation heat pipes.

Optionally, a pipe wall of the helium self-oscillation heat pipe is made of a high thermal-conductivity metal; the helium self-oscillation heat pipe has an inner diameter smaller than 0.8 mm, and a pipe wall with a thickness of 0.1 mm-1 mm.

Optionally, a high thermal-conductivity metal thin tube is further welded or crimped between the helium self-oscillation heat pipe and the main magnetic field superconducting coil or between the helium self-oscillation heat pipe and the shield magnetic field superconducting coil.

Optionally, the main magnetic field superconducting coil, the shield magnetic field superconducting coil and a thermal radiation screen assembly are respectively suspended inside the vacuum container via a thin tension bar.

Optionally, the magnetic resonance imaging superconducting magnet system further comprises an intelligent surveillance system, powered by an independent UPS; the intelligent surveillance system comprises an information monitoring system, an information processing system and an operation control system, wherein the information monitoring system conducts real-time monitoring of operation information comprising an temperature inside the vacuum container and power supply status of external power, and feeds back to the information processing system; the information processing system judges the operation information and instructs the operation control system to correspondingly take actions comprising driving the thermal conduction component auto-pluggable component to detach or restore two thermal conduction components and driving the high-precision superconducting power supply to perform magnet excitation and demagnetization.

Optionally, each of the thermal conduction component auto-pluggable component, the refrigerator, and the high-precision superconducting power supply are powered by an independent UPS.

Optionally, the thermal conduction component auto-pluggable component comprises an electric mechanism and a sealed bellows, wherein the sealed bellows is sleeved in the electric mechanism, and has one end (121) connected with the refrigerator and the other end (122) connected with the vacuum container, for supporting the refrigerator and allowing the refrigerator to take a minor displacement while maintaining vacuum sealing; and the electric mechanism has one end fixed on the vacuum container and the other end fixed on the refrigerator (9), adapted to allow the refrigerator to take a minor displacement.

The present disclosure delivers beneficial effects that:

The intelligent liquid helium-free full-body magnetic resonance imaging superconducting magnet system of the present disclosure can realize high cooling efficiency to meet the cooling demands of the full-body magnetic resonance imaging superconducting magnet system; is capable of thermally connecting or disconnecting the thermal conduction component of the refrigerator with a magnet according to external power status of the system, to achieve the minimum heat leakage rate in the event of power failure; and can realize unmanned intervention in the entire process of normal operation and emergency treatment of the superconducting magnet system to ensure safety and reliability of the magnet.

BRIEF DESCRIPTION OF THE DRAWINGS

In order to make a clearer description of technical solutions in specific implementations of the present invention or prior art, drawings involved in description for the specific implementations or the prior art will be briefly introduced, and apparently, the drawings described below illustrate some implementations of the present invention, for one with ordinary skill in the art, other drawings can also be obtained in accordance with these drawings without delivering creative efforts.

wherein, 1—main magnetic field superconducting coil, 2—shield magnetic field superconducting coil, 3—helium self-oscillation heat pipe, 4—heat pipe gas tank, 5—liquid helium reservoir, 6—liquid-gas storage tank, 7—thermal radiation screen assembly, 8—vacuum container, 9—refrigerator, 10—thermal conduction component auto-pluggable component, 11—intelligent surveillance system, 12—sealed bellows, 13—electric mechanism, 21—first thermal conduction component, 22—second thermal conduction component, 121—end of sealed bellows connected with a refrigerator, 122—end of sealed bellows connected with the vacuum container.

DETAILED DESCRIPTION

Technical solutions of the present invention will be described clearly and completely as follows in conjunction with the drawings, apparently, the described embodiments are just part rather than all embodiments of the present invention. Based on the embodiments in the present invention, all other embodiments obtained by one with ordinary skill in the art without delivering creative efforts shall fall into the protection scope of the present invention.

Figure 1:
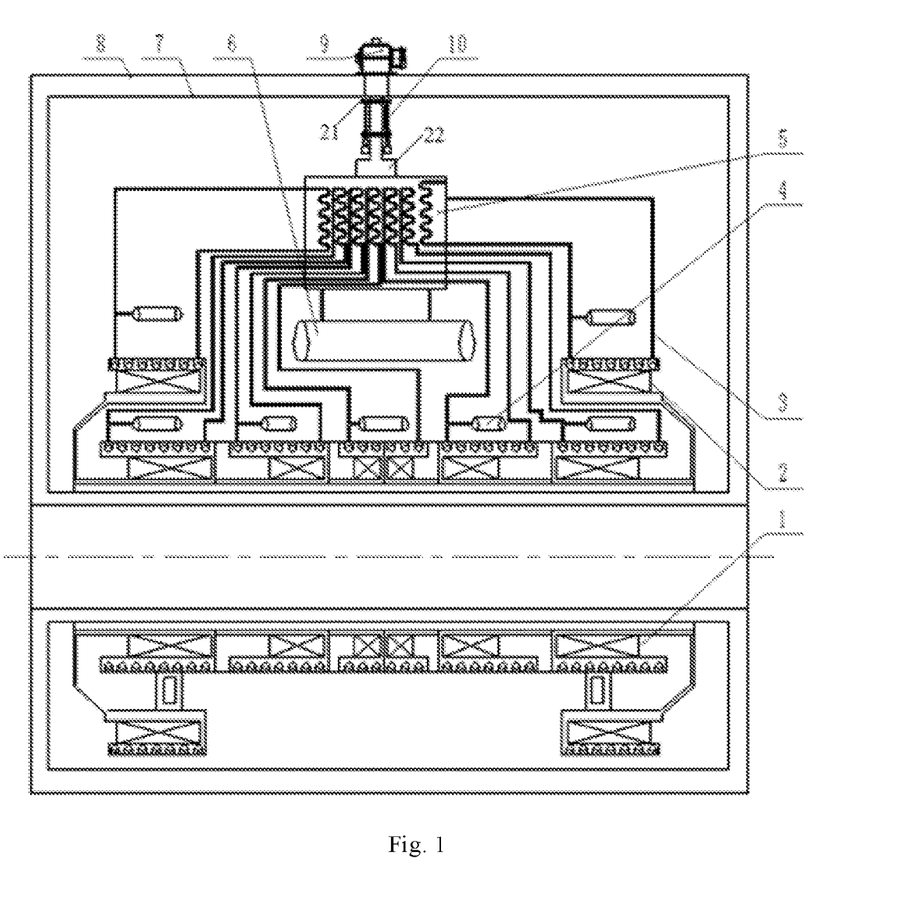
FIG. 1 is a schematic cross-sectional structural diagram of an intelligent liquid helium-free magnetic resonance whole body imaging superconducting magnet system of the present disclosure.

FIG. 1 is a schematic cross-sectional structural diagram of an intelligent liquid helium-free magnetic resonance whole body imaging superconducting magnet system, as shown in FIG. 1, the system comprises a main magnetic field superconducting coil 1, a shield magnetic field superconducting coil 2, a helium self-oscillation heat pipe 3, a heat pipe gas tank 4, a liquid helium reservoir 5, a liquid-gas storage tank 6, a refrigerator 9, a thermal conduction component auto-pluggable component 10 and an intelligent surveillance system 11.

The vacuum container 8 is of an enclosed hollow cylindrical shape, comprising a cylindrical inner tube, a cylindrical outer and circular end members at both ends, wherein the cylindrical inner tube is coaxial with the cylindrical outer tube, the cylindrical outer tube has a diameter greater than that of the cylindrical inner tube, and the circular end members connect the cylindrical inner tube and the cylindrical outer tube to form a sealed cover. A thermal radiation screen assembly 7, which is arranged along an inner wall of the vacuum container 8, constitutes an enclosed hollow cylinder working cabin, in which the superconducting coil comprises a main magnetic field superconducting coil 1 arranged in a radially inner side space and a shield magnetic field superconducting coil 2 arranged in a radially outside space, and a heat pipe gas tank 4 is arranged in a vacant area between the main magnetic field superconducting coil 1 and the shield magnetic field superconducting coil 2, to save space occupied by the system. The main magnetic field superconducting coil 1, the shield magnetic field superconducting coil 2 and the thermal radiation screen assembly 7 are respectively suspended inside the vacuum container 8 via a thin tension bar.

The liquid helium reservoir 5 is communicated with the liquid-gas storage tank 6 through a gas connection channel, and connected with the main magnetic field superconducting coil 1 or the shield magnetic field superconducting coil 2 through the helium self-oscillation heat pipe 3, and the helium self-oscillation heat pipe 3 is further communicated with the heat pipe gas tank 4.

Specifically, the helium self-oscillation heat pipe 3 comprises hot end tightly wound on an outer surface of the main magnetic field superconducting coil 1 and the shield magnetic field superconducting coil 2 respectively, a cold end wound on one side of the liquid helium reservoir 5, and an adiabatic zone arranged as a connection channel between the hot end and the cold end and provided with a gas connection channel and communicated with the heat pipe gas tank 4. One or multiple groups of helium self-oscillation heat pipes 3 may be arranged to enhance cooling capacity.

In the helium self-oscillation heat pipe 3, gas-liquid phase change takes place in the heat pipe at the cold end and the hot end, to realize high efficiency heat transfer using a very small amount of low-temperature working medium (such as liquid helium), and the driving force generated by the gas-liquid phase change enables the gas-liquid phase working medium to conduct high speed circular flow between the cold end and the hot end, so as to realize an extremely high heat conductivity therebetween, of up to $1\times10^4$ Wm/K, far above $5\times10^2$-$1.5\times10^3$ Wm/K of pure copper, satisfying the cooling demand of a whole-body superconducting magnet system.

The pipe wall of the helium self-oscillation heat pipe 3 is made of a high thermal conductivity metal, such as high-purity copper, so as to increase the thermal conductivity of helium self-oscillation heat pipe 3 as well as the heat conduction between the helium self-oscillation heat pipe 3 and the main magnetic field superconducting coil 1 or between the helium self-oscillation heat pipe 3 and the shield magnetic field superconducting coil 2, and between the helium self-oscillation heat pipe 3 and the liquid helium reservoir 5. The thickness of the pipe wall is required to endow the helium self-oscillation heat pipe 3 with a mechanical strength sufficient enough to withstand pressures from two-phase self-oscillation of helium (usually less than 1 MPa) while being as small as possible to reduce thermal resistance. The helium self-oscillation heat pipe 3 with a pipe wall thickness of 0.1 mm-1 mm has an inner diameter less than 0.8 mm, so as to achieve high efficiency self-oscillation.

Preferably, a high thermal-conductivity metal thin tube is welded or tightly crimped between the helium self-oscillation heat pipe 3 and the main magnetic field superconducting coil 1 or between the helium self-oscillation heat pipe 3 and the shield magnetic field superconducting coil 2, as a cold end of the helium self-oscillation heat pipe 3. The metal thin tube increases the heat conducting area between the helium self-oscillation heat pipe 3 and the superconducting coil on one hand while mechanically fixing the superconducting coil and the helium self-oscillation heat pipe.

The refrigerator 9 is fixed on the vacuum container 8 through thermal conduction component auto-pluggable component 10. The first thermal conduction component 21 connected with the refrigerator 9 is in close contact with the thermal radiation screen assembly 7 under pressure, and the second thermal conduction component 22 connected with the refrigerator 9 is in close contact with the other side of the liquid helium reservoir 5 by mechanical compression.

When the superconducting magnet system does not conduct refrigeration, both the liquid-gas storage tank 6 and the heat pipe gas tank 4 store and seal high pressure helium gas; the high pressure helium gas is filled to a point when the amount of liquid helium condensed from the helium gas accounts for 20%-40% of the total volume of the helium self-oscillation heat pipe, to achieve maximum heat transfer efficiency.

When the superconducting magnet system conducts refrigeration, the second thermal conduction component 22 connected with the refrigerator 9 condenses helium gas in the liquid-gas storage tank 6 into liquid helium in a liquid storage tank 5, and the helium gas in the heat pipe gas tank 4 is in turn condensed into liquid helium in a cold end of the helium self-oscillation heat pipe 3, so as to form helium self-oscillation gas-liquid circulation, transfer the cooling capacity of the refrigerator 9 to the main magnetic field superconducting coil 1 and the shield magnetic field superconducting coil 2, and cool the main magnetic field superconducting coil 1 and the shield magnetic field superconducting coil 2 down rapidly and uniformly to a working temperature.

Figure 2:
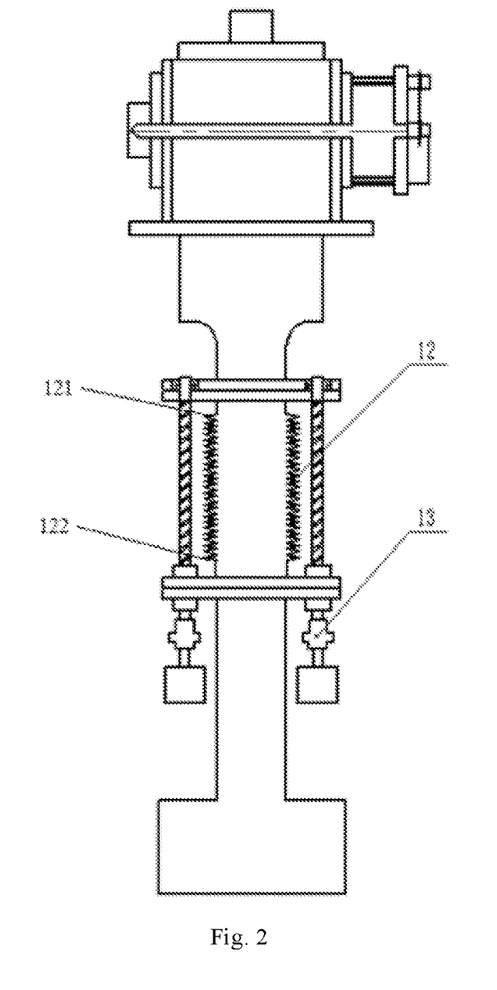
FIG. 2 is a schematic structural diagram of an auto-pluggable component of a thermal conduction component of the present disclosure.

FIG. 2 is a schematic structural diagram of an auto-pluggable component of a thermal conduction component, thermal conduction component auto-pluggable component 10 is able to detach the thermal conduction component from the magnet low-temperature system to recover heat connection of the thermal conduction component with the magnet low-temperature system, and comprises an electric mechanism 13 and a sealed bellows 12, wherein the sealed bellows 12 is sleeved in an electric mechanism 13 and has one end 121 connected with a refrigerator 9 and the other end 122 connected with the vacuum container 8, for supporting the refrigerator 9 and allowing the refrigerator 9 to take a minor displacement (e.g., 1 mm in the vertical direction) while maintaining vacuum sealing; and the electric mechanism 13 has one end fixed on the vacuum container 8 and the other end fixed on the refrigerator 9, is adapted to allow the refrigerator 9 to take a minor displacement (e.g., 1 mm in the vertical direction), and can be motor, solenoid valve, piezoelectric ceramic and other electrical or mechanical structures.

When the magnet cools down and functions normally, the electric mechanism of thermal conduction component auto-pluggable component drives the refrigerator to take a minor displacement, enabling the first thermal conduction component 21 connected with the refrigerator to get into close contact with the thermal radiation screen assembly and transfer the cooling capacity to the thermal radiation screen assembly, and enabling the second thermal conduction component 22 connected with the refrigerator to get into close contact with the liquid helium reservoir, so as to condense the helium gas in the liquid-gas storage tank into liquid helium in the liquid helium reservoir, realizing transmission of the cooling capacity of the refrigerator towards the magnet inwardly; in the event of power cut or artificial power cut, the electric mechanism of thermal conduction component auto-pluggable component drives the refrigerator to make a small displacement in the opposite direction, detaching the second thermal conduction component 22 from the liquid helium reservoir, and detaching the first thermal conduction component 21 from the thermal radiation screen assembly, realizing thermal isolation between superconducting magnet and refrigerator, thus avoiding the rapid loss of self-cooling capacity of superconducting magnet. The liquid helium in the liquid helium reservoir can maintain the low temperature system for a longer time, so that the magnet can maintain its normal operation for a long time, facilitating the magnet conducting protection operations such as demagnetization After the electricity is restored, thermal conduction component auto-pluggable component drives the refrigerator to move once again, and restores close thermal contact between the first thermal conduction component 21 and the second thermal conduction component 22 with the thermal radiation screen assembly and the liquid helium reservoir, so as to conduct refrigeration for the superconducting magnet system once again, allowing the magnet system to quickly restore the normal working state.

Figure 3:
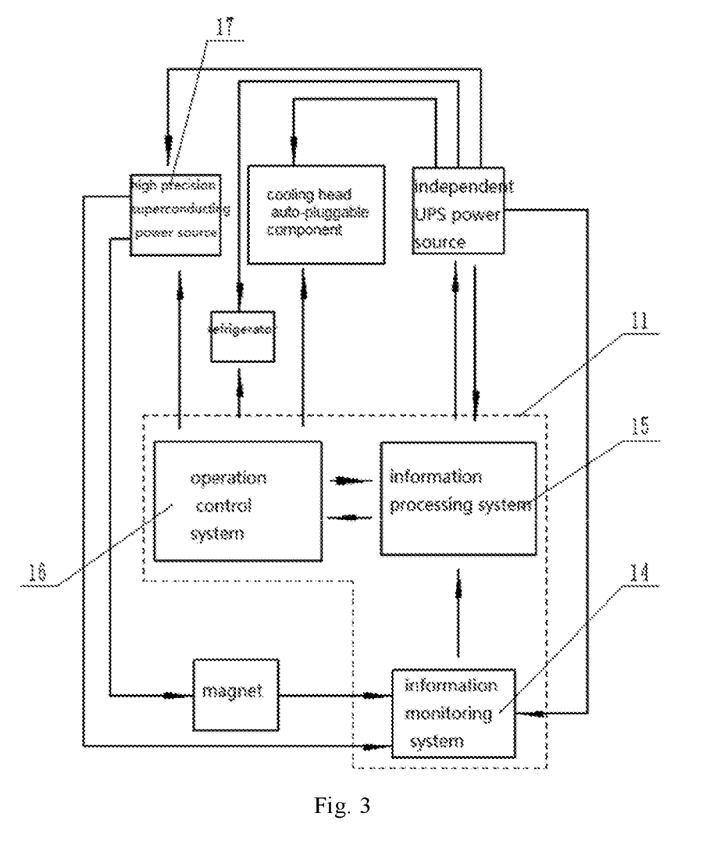
FIG. 3 is a structural block diagram of an intelligent surveillance system.

Actions across the whole working process of the superconducting magnet system, such as refrigeration, excitation, stable operation, quench detection, failure monitoring, demagnetization, etc., are managed automatically by an intelligent surveillance System 13, which can realize intelligent operation of the system free of human intervention. The superconducting magnet system also comprises an intelligent surveillance system 11, which is powered by an independent UPS (uninterruptible power supply) power supply, which can still maintain normal operations of itself as well as the superconducting magnet system when failure occurs in the external power system and take corresponding protective actions. The intelligent surveillance system 11 comprises an information monitoring system 14, an information processing system 15 and an operation control system 16, wherein, the information monitoring system 14 conducts real-time monitoring of operation information comprising an temperature inside the magnet and status of external power, and feeds back to the information processing system 15, wherein, the magnet is internally provided with a temperature sensor. The information processing system 15 judges the operation information and instructs the operation control system 16 to correspondingly take actions, comprising driving thermal conduction component auto-pluggable component 10 to detach or restore two thermal conduction components and driving the high-precision superconducting power supply 17 to perform magnet excitation and demagnetization. The high-precision superconducting power supply can guarantee that the magnetic field accuracy reaches a normal imaging level (with the current accuracy less than one in a million), so as to restore the normal operation of the magnetic resonance imaging system.

Each of the thermal conduction component auto-pluggable component 10, the refrigerator 19, and the high-precision superconducting power supply 17 can be powered by an independent UPS.

When monitoring external electrical faults of the magnet, such as power failures, the intelligent surveillance system 11 first drives the thermal conduction component auto-pluggable component 10 to detach the thermal conduction component of the refrigerator 9 from the superconducting magnet system, and reduces heat leakage of the superconducting magnet system. For short-term power failures, the intelligent surveillance system 11 can wait until external power recovery to drive the thermal conduction component auto-pluggable component 10 to restore thermal connection of the thermal conduction component of the refrigerator 9 with the superconducting magnet system, so as to recover normal operation of the superconducting magnet system; and for prolonged power outages, when the temperature in the magnet is monitored to exceed a preset limit, the intelligent surveillance system 11 is powered by a UPS power supply 18, and first drives the thermal conduction component auto-pluggable component 10 to restore thermal connection of the thermal conduction component of the refrigerator 9 with the superconducting magnet system, so as to recover normal operation of the refrigerator 8, before automatically operating the high-precision superconducting power supply 17, thus reducing the current in the magnet to zero to avoid occurrence of quench, and after recovery of external power, the high-precision superconducting power supply 17 automatically operated once again to conduct magnet excitation and charge the UPS power source 18, enabling the magnet to restore normal operation of the system.

The above contents describe merely exemplary embodiments of the present disclosure, and are not intended to limit the present disclosure. Any modification, equivalent substitution, improvement, etc. made consistent with the spirit and principle of the present disclosure shall be included in the protection scope of the present disclosure.

What is claimed is:

1. A magnetic resonance imaging superconducting magnet system, comprising:
    a vacuum container, for arranging a superconducting coil therein;
    a refrigerator, for cooling an interior of the vacuum container;
    a thermal conduction component, connected with the refrigerator and inserted in the vacuum container for causing the refrigerator to cool the interior of the vacuum container, having a first state, in which the thermal conduction component transfers heat with the interior of the vacuum container, and a second state, in which the thermal conduction component is thermally isolated from the interior of the vacuum container, and adapted to move relative to the vacuum container, so as to switch between the first state and the second state, wherein the thermal conduction component comprises a second thermal conduction component transferring heat with the superconducting coil and adapted to move relative to the superconducting coil, so as to switch between a first state, at which the second thermal conduction component transfers heat with the superconducting coil, and a second state, at which the second thermal conduction component is thermally isolated from the superconducting coil;
    a liquid helium reservoir, adapted to get into contact and separated from the second thermal conduction component; and
    a helium self-oscillation heat pipe, for transferring heat between the liquid helium reservoir and the superconducting coil.

2. The magnetic resonance imaging superconducting magnet system of claim 1, further comprising a thermal radiation screen assembly arranged along an inner wall of the vacuum container, the thermal conduction component comprises a first thermal conduction component transferring heat with the thermal radiation screen assembly and adapted to move relative to the thermal radiation screen assembly, so as to switch between a first position, at which the first thermal conduction component is in contact with the thermal radiation screen assembly, and a second position, at which the first thermal conduction component is separated from the thermal radiation screen assembly.

3. The magnetic resonance imaging superconducting magnet system of claim 1, wherein,
    the thermal radiation screen assembly constitutes an enclosed hollow cylinder working cabin, in which the superconducting coil comprises a main magnetic field superconducting coil arranged in a radially inner side space and a shield magnetic field superconducting coil arranged in a radially outside space, and a heat pipe gas tank is arranged in a vacant area between the main magnetic field superconducting coil and the shield magnetic field superconducting coil;
    the magnetic resonance imaging superconducting magnet system further comprises a liquid helium reservoir communicated with a liquid-gas storage tank, and connected with the main magnetic field superconducting coil or the shield magnetic field superconducting coil via a helium self-oscillation heat pipe which is also communicated with the heat pipe gas tank.

4. The magnetic resonance imaging superconducting magnet system of claim 1, wherein, the vacuum container comprises a cylindrical inner tube and a cylindrical outer tube which are coaxial, and circular end members at both ends, the cylindrical outer tube has a diameter greater than that of the cylindrical inner tube, and the circular end member connects the cylindrical inner tube and the cylindrical outer tube to form a sealed cover.

5. The magnetic resonance imaging superconducting magnet system of claim 3, wherein, the helium self-oscillation heat pipe comprises a hot end tightly wound on an outer surface of the main magnetic field superconducting coil or the shield magnetic field superconducting coil, a cold end wound on the liquid helium reservoir, and an adiabatic zone arranged between the hot end and the cold end and provided with a gas connection channel and communicated with the heat pipe gas tank.

6. The magnetic resonance imaging superconducting magnet system of claim 3, wherein, a pipe wall of the helium self-oscillation heat pipe is made of a high thermal-conductivity metal and has an inner diameter smaller than 0.8 mm, and the pipe wall has a thickness of 0.1 mm-1 mm.

7. The magnetic resonance imaging superconducting magnet system of claim 3, wherein, a high thermal-conductivity metal thin tube is welded or crimped between the helium self-oscillation heat pipe and the main magnetic field superconducting coil or between the helium self-oscillation heat pipe and the shield magnetic field superconducting coil.

8. The magnetic resonance imaging superconducting magnet system of claim 3, wherein, the main magnetic field superconducting coil, the shield magnetic field superconducting coil and the thermal radiation screen assembly are respectively suspended inside the vacuum container via a thin tension bar.

9. The magnetic resonance imaging superconducting magnet system of claim 1, further comprising a surveillance system powered by a constant power supply, the surveillance system comprises:
- an information monitoring system, for real-time monitoring operation information comprising a temperature inside the vacuum container and power supply status of external power; and
- an information processing system, for judging the operation information and instructing an operation control system to correspondingly take actions which comprise that the thermal conduction component moves relative to the vacuum container and that a high-precision superconducting power supply performs magnet excitation and demagnetization.

10. The magnetic resonance imaging superconducting magnet system of claim 1, wherein, at least one of the refrigerator, an auto-pluggable component of the thermal conduction component for driving the thermal conduction component to move relative to the vacuum container, and a high-precision superconducting power supply for charging the superconducting coils is powered by a constant power supply.

11. The magnetic resonance imaging superconducting magnet system of claim 1, further comprising an auto-pluggable component of the thermal conduction component which drives the thermal conduction component to move relative to the vacuum container and comprises an electric mechanism and a sealed bellows, the sealed bellows is sleeved in an electric mechanism and has one end connected with a refrigerator and the other end connected with the vacuum container, for supporting the refrigerator and allowing the refrigerator to take a minor displacement while maintaining vacuum sealing; and the electric mechanism has one end fixed on the vacuum container and the other end fixed on the refrigerator, adapted to allow the refrigerator to take a minor displacement.

12. The magnetic resonance imaging superconducting magnet system of claim 1, comprising an intelligent magnetic resonance whole body imaging superconducting magnet system.

* * * * *